(12) United States Patent
Wu et al.

(10) Patent No.: US 11,043,415 B2
(45) Date of Patent: Jun. 22, 2021

(54) ENHANCED COBALT AGGLOMERATION RESISTANCE AND GAP-FILL PERFORMANCE BY RUTHENIUM DOPING

(71) Applicant: Applied Materials, Inc., Santa Clara, CA (US)

(72) Inventors: Zhiyuan Wu, San Jose, CA (US); Nikolaos Bekiaris, Campbell, CA (US); Mehul B. Naik, San Jose, CA (US); Jin Hee Park, Santa Clara, CA (US); Mark Hyun Lee, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/564,489

(22) Filed: Sep. 9, 2019

(65) Prior Publication Data
US 2020/0235006 A1     Jul. 23, 2020

Related U.S. Application Data

(63) Continuation of application No. 15/874,041, filed on Jan. 18, 2018, now Pat. No. 10,410,918.
(Continued)

(51) Int. Cl.
*H01L 21/768*     (2006.01)
*H01L 23/532*     (2006.01)
(Continued)

(52) U.S. Cl.
CPC .... *H01L 21/76846* (2013.01); *H01L 21/2885* (2013.01); *H01L 21/28568* (2013.01);
(Continued)

(58) Field of Classification Search
CPC ....... H01L 21/0415; H01L 21/046–047; H01L 21/265–266; H01L 21/3115–31155;
(Continued)

(56) References Cited

U.S. PATENT DOCUMENTS

| 7,429,402 | B2 | 9/2008 | Gandikota et al. |
| 7,691,442 | B2 | 4/2010 | Gandikota et al. |

(Continued)

FOREIGN PATENT DOCUMENTS

| CN | 102341903 A | 2/2012 |
| CN | 104205302 A | 12/2014 |

(Continued)

OTHER PUBLICATIONS

International Search Report and Written Opinion dated Jun. 22, 2018 for Application No. PCT/US2018/014210.
(Continued)

*Primary Examiner* — Mohammad M Hoque
(74) *Attorney, Agent, or Firm* — Patterson + Sheridan, LLP

(57) ABSTRACT

In one implementation, a method of forming a cobalt layer on a substrate is provided. The method comprises forming a barrier and/or liner layer on a substrate having a feature definition formed in a first surface of the substrate, wherein the barrier and/or liner layer is formed on a sidewall and bottom surface of the feature definition. The method further comprises exposing the substrate to a ruthenium precursor to form a ruthenium-containing layer on the barrier and/or liner layer. The method further comprises exposing the substrate to a cobalt precursor to form a cobalt seed layer atop the ruthenium-containing layer. The method further comprises forming a bulk cobalt layer on the cobalt seed layer to fill the feature definition.

20 Claims, 8 Drawing Sheets

Related U.S. Application Data

(60) Provisional application No. 62/449,791, filed on Jan. 24, 2017.

(51) Int. Cl.

| | | |
|---|---|---|
| *H01L 23/528* | (2006.01) | |
| *H01L 21/288* | (2006.01) | |
| *H01L 21/285* | (2006.01) | |
| *H01L 21/67* | (2006.01) | |

(52) U.S. Cl.
CPC .. *H01L 21/67207* (2013.01); *H01L 21/76862* (2013.01); *H01L 21/76864* (2013.01); *H01L 21/76873* (2013.01); *H01L 21/76876* (2013.01); *H01L 21/76882* (2013.01); *H01L 23/528* (2013.01); *H01L 23/53209* (2013.01); *H01L 23/53252* (2013.01); *H01L 21/28556* (2013.01); *H01L 21/67167* (2013.01); *H01L 21/67184* (2013.01); *H01L 21/76856* (2013.01)

(58) Field of Classification Search
CPC ..... H01L 21/3215–32155; H01L 21/425–426; H01L 21/76846; H01L 21/67207; H01L 23/528; H01L 23/53209; H01L 21/2885; H01L 21/76862; H01L 21/76882; H01L 21/76873; H01L 21/76864; H01L 21/76876; H01L 21/28568; H01L 23/53252; H01L 21/67184; H01L 21/67167; H01L 21/76825; H01L 21/76859
USPC ......................................................... 438/653
See application file for complete search history.

(56) References Cited

U.S. PATENT DOCUMENTS

| | | |
|---|---|---|
| 10,043,709 B2 | 8/2018 | Ai et al. |
| 2006/0223300 A1 | 10/2006 | Simka et al. |
| 2006/0240187 A1 | 10/2006 | Weidman |
| 2008/0120580 A1* | 5/2008 | Hsu .................. H01L 21/76849 257/751 |
| 2009/0246952 A1 | 10/2009 | Ishizaka et al. |
| 2010/0295181 A1* | 11/2010 | Yang ................ H01L 23/53238 257/751 |
| 2012/0141667 A1 | 6/2012 | Kim et al. |
| 2012/0161320 A1 | 6/2012 | Akolkar et al. |
| 2012/0252207 A1 | 10/2012 | Lei et al. |
| 2012/0309190 A1 | 12/2012 | Kelly et al. |
| 2013/0260555 A1 | 10/2013 | Zope et al. |
| 2014/0183738 A1* | 7/2014 | Jezewski .......... H01L 21/76871 257/751 |
| 2015/0093891 A1 | 4/2015 | Zope et al. |
| 2015/0203961 A1* | 7/2015 | Ha .................... H01L 21/76868 427/124 |
| 2016/0056074 A1 | 2/2016 | Na et al. |
| 2018/0144973 A1 | 5/2018 | Ye et al. |

FOREIGN PATENT DOCUMENTS

| | | |
|---|---|---|
| CN | 105518827 A | 4/2016 |
| JP | 2008-244017 A | 10/2008 |
| JP | 2016-046532 A | 4/2016 |
| KR | 10-2016-0063378 A | 6/2016 |
| WO | 2016144433 A1 | 9/2016 |

OTHER PUBLICATIONS

Office Action for Japanese Application No. 2019-539952 dated Dec. 8, 2020.
Supplementary Search Report for European Application No. 18744306.4 dated Sep. 22, 2020.
Office Action for Chinese Application No. 201880008174.9 dated Dec. 1, 2020.
Search Report for Chinese Application No. 201880008174.9 dated Nov. 24, 2020.
Office Action for Korean Application No. 10-2019-7024595 dated Apr. 13, 2021.

* cited by examiner

ENHANCED COBALT AGGLOMERATION RESISTANCE AND GAP-FILL PERFORMANCE BY RUTHENIUM DOPING

CROSS-REFERENCE TO RELATED APPLICATIONS

This application is a continuation of U.S. patent application Ser. No. 15/874,041, filed Jan. 18, 2018, which claims benefit of United States Provisional Patent Application Ser. No. 62/449,791, filed Jan. 24, 2017. All of the aforementioned related patent applications are incorporated by reference herein in their entirety.

BACKGROUND

Field

Implementations of the present disclosure generally relate to methods of processing substrates, and specifically to methods for cobalt gap-fill.

Description of the Related Art

Microelectronic devices, such as micro-scale electronic, electro-mechanical or optical devices are generally fabricated on and/or in substrates, such as silicon wafers. In a typical fabrication process, for example on a semiconductor material wafer, a conductive layer is first applied onto the surface of the substrate using chemical vapor deposition (CVD), physical vapor deposition (PVD), electroless plating processes, or other suitable methods. After forming the conductive layer, a layer of metal is plated onto the substrate by applying an appropriate electrical potential between the conductive layer and one or more electrodes in the presence of an electro-processing solution containing metal ions. The substrate is then cleaned and/or annealed in subsequent procedures to form devices, contacts or conductive lines. Some substrates may have a barrier and/or liner layer with the conductive layer formed on the barrier and/or liner layer.

Currently, most microelectronic devices are made on substrates plated with copper (Cu). Although copper has high conductivity, it typically needs thick barrier and/or liner layers, such as tantalum nitride (TaN), to prevent diffusion of copper into the substrate or dielectric material on the substrate. These types of barrier and/or liner layers have relatively low conductivity. Using known techniques, features on the substrate are filled with electroplated copper using acidic copper electroplating solutions. These electroplating solutions often use additives to promote a super-conformal fill process (with the features filling primarily from the bottom up, rather than inwardly from the sides) to create a void-free fill. As the feature sizes shrink, achieving void-free fill with the traditional copper plating processes has become more difficult. In addition, as the features get smaller, the barrier and/or liner layers for copper occupies a larger relative volume of the smaller feature, because a minimum barrier layer thickness is maintained to prevent copper diffusion, regardless of feature size.

For example, if a minimum barrier and/or liner layer thickness of 3 nm is needed to prevent diffusion of copper, then for a feature having a 60 nm critical dimension with an aspect ratio of 4:1, the barrier and/or liner layer occupies roughly 11% of the cross-sectional area. However, with a feature a having a 20 nm critical dimension with an aspect ratio of 2:1, the barrier and/or liner layer remains 3 nm thick, but it now occupies 33% of the cross sectional area. In this case the volume of the barrier and/or liner layer (which has low conductivity) is proportionally higher, so the resistance of the interconnect, via or other feature is proportionally higher. With progressively smaller features, the proportion of copper to barrier and/or liner layer increases, to the extent that the resistance becomes unacceptable.

One approach proposed for overcoming this technical challenge is to replace copper with a metal that does not need thick barrier and/or liner layers, such as cobalt (Co). Although cobalt has a higher resistivity than copper (6.2 µOhm-cm versus 1.7 µOhm-cm), cobalt may not need the thick barrier and/or liner layers to prevent diffusion into the silicon or dielectric. However, at current processing temperatures, cobalt agglomeration presents an issue. This cobalt agglomeration leads to formation of voids in the final structure, which not only increases resistance but also decreases the reliability of the final structure.

Therefore, new techniques are needed for conformal and defect free filling of narrow features with cobalt.

SUMMARY

Implementations of the present disclosure generally relate to methods of processing substrates, and specifically to methods for cobalt gap-fill. In one implementation, a method of forming a cobalt layer on a substrate is provided. The method comprises exposing a substrate having a feature definition formed in a first surface of the substrate to a ruthenium precursor to form a ruthenium-containing layer on the first surface of the substrate and on a sidewall and bottom surface of the feature definition. The method further comprises exposing the substrate to a cobalt precursor to form a cobalt seed layer atop the ruthenium-containing layer.

In another implementation, a method of forming a cobalt layer on a substrate is provided. The method comprises forming a barrier and/or liner layer on a substrate having a feature definition formed in a first surface of the substrate. The barrier and/or liner layer is formed on a sidewall and bottom surface of the feature definition. The method further comprises exposing the substrate to a ruthenium precursor to form a ruthenium-containing layer on the barrier and/or liner layer. The method further comprises exposing the substrate to a cobalt precursor to form a cobalt seed layer atop the ruthenium-containing layer. The method further comprises forming a bulk cobalt layer on the cobalt seed layer to fill the feature definition.

In yet another implementation, a method of forming a cobalt layer on a substrate is provided. The method comprises forming a barrier and/or liner layer on a substrate having a feature definition formed in a first surface of the substrate. The barrier and/or liner layer is formed on a sidewall and bottom surface of the feature definition. The method further comprises exposing the substrate to a cobalt precursor to form a cobalt seed layer atop the barrier and/or liner layer. The method further comprises exposing the cobalt seed layer to a ruthenium process to form a ruthenium doped cobalt seed layer.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
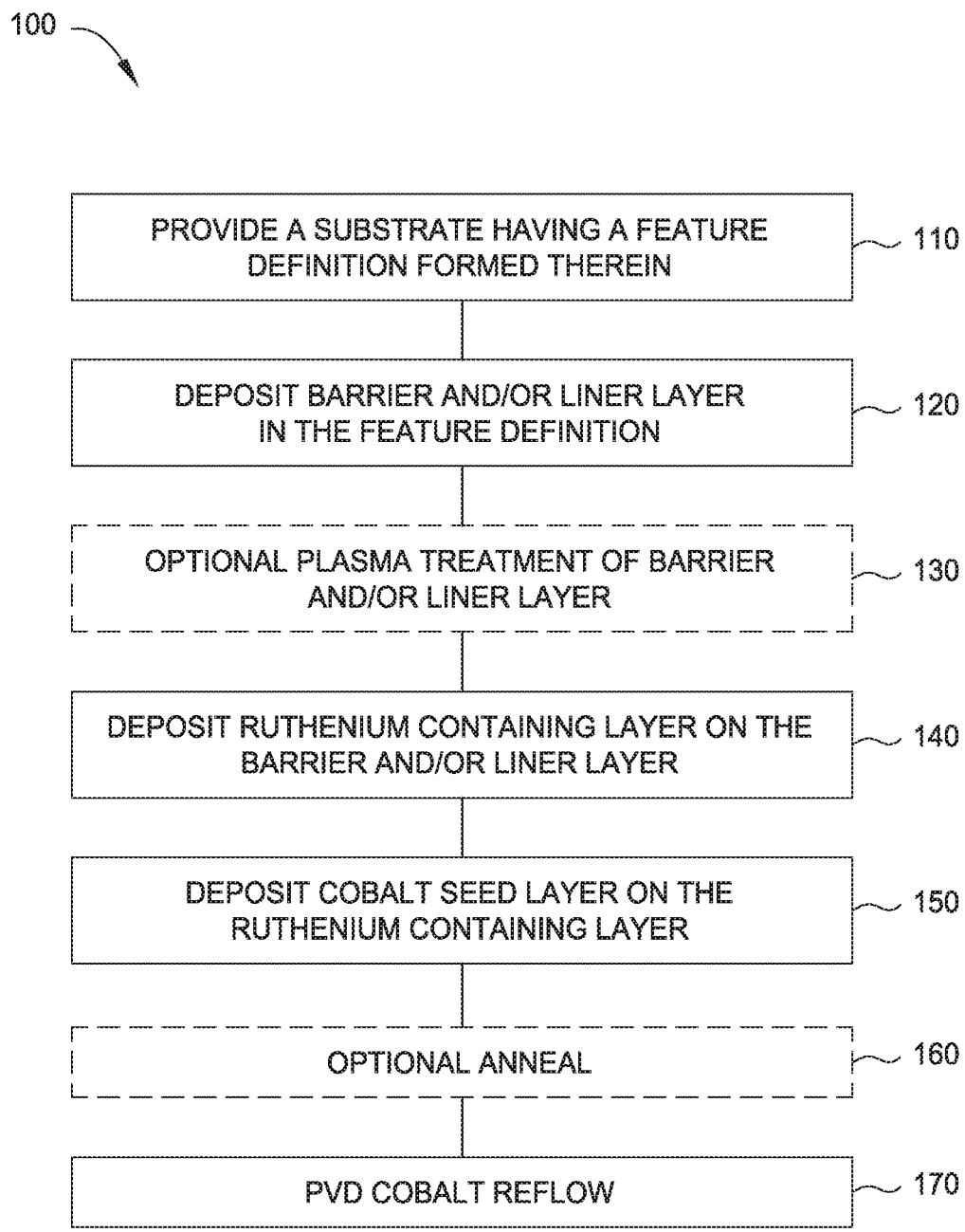
FIG. 1 depicts a flow diagram of a process sequence for forming a cobalt layer in a semiconductor device in accordance with one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods of processing substrates, and specifically to methods for cobalt gap-fill. Certain details are set forth in the following description and in FIGS. 1-7 to provide a thorough understanding of various implementations of the disclosure. Other details describing well-known structures and systems often associated with ruthenium and cobalt deposition are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a cobalt deposition process that can be carried out using a system, such as an Endura® Volta™ CVD cobalt available from Applied Materials, Inc. of Santa Clara, Calif. Other tools capable of performing cobalt deposition processes may also be adapted to benefit from the implementations described herein. In addition, any system enabling the ruthenium and cobalt deposition processes described herein can be used to advantage. The apparatus description described herein is illustrative and should not be construed or interpreted as limiting the scope of the implementations described herein.

The increase in transistor density combined with the shrinking technology nodes (≤11 nanometers) of advanced CMOS transistors has resulted in decrease in the cross-section dimensions of conducting metal layers utilized during semiconductor manufacturing. Examples of such metal conducting layers include metal contact fill, metal gate fill and interconnect fill. Very narrow cross-section dimensions (e.g., <10 nanometers) for these applications necessitates a metal fill technology without the need of thick high resistivity barrier and/or liner layers. As critical dimensions shrink (e.g., <20 nanometers), the increase in resistivity of cobalt is expected to slower than copper and is thus not proportional at smaller critical dimensions. Cobalt also provides resistivity benefits relative to copper at smaller critical dimensions. In addition, cobalt demonstrates improved reliability relative to copper at smaller critical dimensions. Gap-fill methods utilizing CVD cobalt processes provide a potential low contact resistance (Rc) one-material solution for gap-fill. It is desirable that the CVD cobalt films have conformal coverage and low roughness. However, at current processing temperatures, cobalt agglomeration increases roughness and reduces conformal coverage. It has been found by the inventors that doping the cobalt layer with ruthenium reduces agglomeration. The cobalt layer may be doped with ruthenium by depositing ruthenium prior to, during deposition of, and/or after deposition of the cobalt layer. In one implementation, doping of the cobalt layer may be achieved by at least one of depositing a thin layer of ruthenium material prior to cobalt deposition, co-flowing ruthenium precursors with the cobalt precursors, and exposing the cobalt layer to ruthenium material in a post-deposition process. The post-deposition process may be a physical implant process, a soak process where the cobalt layer is exposed to a ruthenium-containing atmosphere for a period of time, or deposition of a thin layer of ruthenium on the cobalt layer. In one implementation, the ruthenium doped cobalt seed layer is formed as a laminate structure by cyclic deposition of ruthenium and cobalt to form a multi-layer ruthenium and cobalt structure. This reduction in agglomeration allows for annealing of the deposited cobalt, which removes impurities from the deposited cobalt leading to reduced resistance.

FIG. 1 depicts a flow diagram of a processing sequence 100 for forming a cobalt layer in a semiconductor device in accordance with one or more implementations of the present disclosure. The processing sequence 100 described in FIG. 1 corresponds to the fabrication stages depicted in FIGS. 2A-2F, which are discussed below. FIGS. 2A-2F depict cross-sectional views of a workpiece 200 having a substrate 202 with a device structure 208 formed thereon during different stages of forming a cobalt layer within a feature definition of the device structure 208 illustrated in processing sequence 100.

Figure 2A:
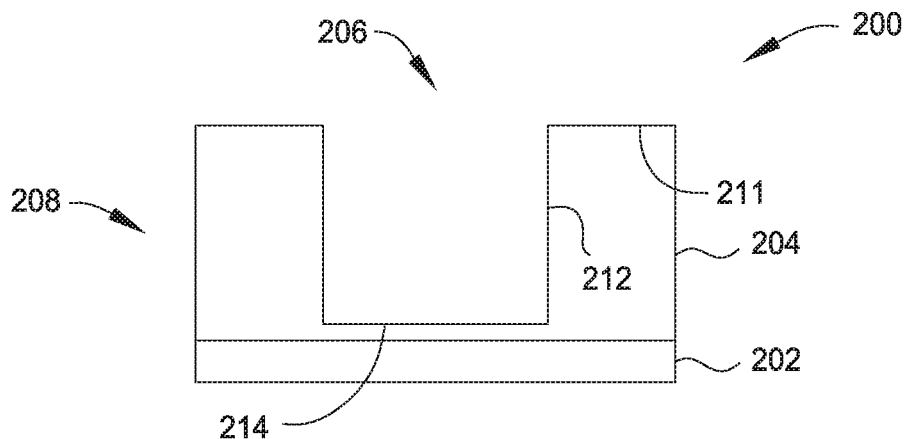
FIGS. 2A-2F depict cross-sectional views of a semiconductor device during formation of a cobalt layer in accordance with one or more implementations of the present disclosure.

The processing sequence 100 starts at operation 110 by providing a workpiece having a substrate with a feature definition formed within, such as the substrate 202 having feature definition 206 formed therein as depicted in FIG. 2A. The feature definition may be selected from vias, trenches, lines, contact holes, and damascene features. The workpiece 200 is positioned into a processing chamber. The workpiece 200, shown in FIG. 2A, includes the substrate 202 having the device structure 208 (e.g., such as a contact structure, a gate structure or an interconnect structure) formed on the substrate 202. It is noted that this particular device structure 208 may be used in three-dimensional (3-D) flash memory applications, DRAM applications, or other suitable applications with high aspect ratio or other odd geometries.

A layer 204 is formed on the substrate 202. The layer 204 has a feature definition 206 formed therein with high aspect ratios, such as aspect ratios greater than 1:1, for example about greater than 10:1, such as about greater than 20:1. The feature definition 206 is formed in the device structure 208 and has sidewalls 212 and a bottom surface 214, which form an open channel to expose the underlying layer 204. The layer 204 may include any suitable layers such as a single silicon layer, a high-k dielectric layer, a low-k dielectric layer or a multiple layer film stack having at least one of the aforementioned layers formed therein. In one implementation where the layer 204 is in the form of a single layer, the layer 204 may be a silicon oxide layer, an oxide layer, a silicon nitride layer, a nitride layer, a silicon oxynitride layer, a titanium nitride layer, a polysilicon layer, a microcrystalline silicon layer, a monocrystalline silicon, a doped polysilicon layer, a doped microcrystalline silicon layer, or a doped monocrystalline silicon.

In another example, where layer 204 is a silicon-containing layer, the layer 204 may be a film stack including a low-k dielectric layer, a composite oxide and nitride layer, at least one or more oxide layers sandwiching a nitride layer, and combinations thereof. Suitable dopants doped in the layer 204 may include p-type dopants and n-type dopants, such as boron (B) containing dopants or phosphine (P) containing dopants. In one implementation wherein the layer 204 is in the form of a multiple film stack having at least one silicon-containing layer; the silicon-containing layer may include repeating pairs of layers including a silicon-containing layer and a dielectric layer. In one implementation, the layer 204 may include a polysilicon layer and/or other metal materials and/or a dielectric layer disposed therein. Suitable examples of the dielectric layer may be selected from a group consisting of an oxide layer, silicon oxide layer, a silicon nitride layer, a nitride layer, titanium nitride layer, a composite of oxide and nitride layer, at least one or more oxide layers sandwiching a nitride layer, and combinations thereof, among others.

Prior to transferring the workpiece 200 into a processing chamber described at operation 110, a pre-cleaning process is optionally performed to treat the substrate surface 211, sidewalls 212 and the bottom surface 214 of the feature definition 206 to remove native oxides or other sources of contaminants. Removal of native oxides or other sources of contaminants from the substrate 202 may provide a low contact resistance surface to form a good contact surface for forming a metal layer.

The pre-cleaning process performed includes supplying a pre-cleaning gas mixture into a pre-cleaning chamber. The pre-cleaning chamber may be a Preclean PCII chamber, PCXT Reactive Preclean™ (RPC) chamber, AKTIV® Pre-Clean™ chamber, SICONI® chamber or Capra™ chamber, all of which are available from Applied Materials, Inc., Santa Clara, Calif. The pre-cleaning chamber may be incorporated in an integrated processing tool, such as the illustrative multi-chamber processing system 700 (see FIG. 7). It is noted that other pre-cleaning chambers available from other manufactures may also be utilized to practice the implementations described herein.

Figure 2B:
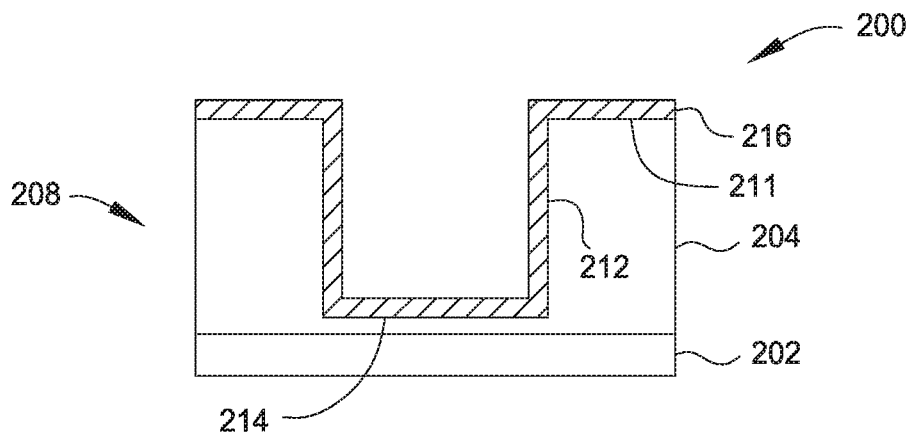

At operation 110 a barrier and/or liner layer deposition process may be performed to deposit a barrier and/or liner layer 216 in the feature definition 206 as shown in FIG. 2B. The barrier and/or liner layer 216 generally prevents diffusion of the metal layer to the junction material on the substrate 202, typically a silicon or silicon germanium compound. The barrier and/or liner layer generally contains a metal or a metal nitride material, such as titanium (Ti), titanium nitride (TiN), alloys thereof, or combinations thereof. The barrier and/or liner layer 216 may also comprise plasma nitrided ($N_2$ or $NH_3$) titanium material. In some implementations where the barrier and/or liner layer 216 comprises a nitrided titanium layer, only the top few angstroms of titanium are converted to a TiN compound. It has been found that both oxidized and non-oxidized titanium and TiN barrier and/or liner layers provide for improved diffusion resistance. The barrier and/or liner layer 216 may have a thickness within a range from about 2 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 10 Å to about 20 Å, more narrowly within a range from about 5 Å to about 15 Å, and more narrowly within a range from about 5 Å to about 10 Å. The barrier and/or liner layer 216 is generally deposited by atomic layer deposition (ALD), plasma-enhanced ALD (PE-ALD), chemical vapor deposition (CVD), or physical vapor deposition (PVD) processes. The barrier and/or liner layer 216, as described above, generally prevents diffusion of the metal layer to the junction material on the substrate. In one implementation, the barrier and/or liner layer 216 is a TiN layer deposited by ALD having a thickness from about 10 Å to about 20 Å.

Optionally, at operation 130, the barrier and/or liner layer 216 is exposed to a plasma treatment process. Not to be bound by theory but it is believed that the plasma treatment process reduces surface roughness of the deposited barrier and/or liner layer 216 by reducing impurities and densifying the barrier and/or liner layer 216.

Exemplary plasma forming gases for the plasma treatment process of operation 130 include hydrogen ($H_2$), nitrogen ($N_2$), ammonia ($NH_3$), and combinations thereof. During the plasma treatment process, several process parameters are also regulated. In one implementation, the process pressure is controlled at between about 0.1 Torr and about 100 Torr (e.g., between about 0.1 Torr and about 80 Torr; between about 1 Torr and about 20 Torr or between about 7 Torr and about 30 Torr). In one implementation, the processing temperature is between about 100 degrees Celsius and about 900 degrees Celsius (e.g., between about 125 degrees Celsius and about 350 degrees Celsius; between about 200 degrees Celsius and about 300 degrees Celsius; or between about 250 degrees Celsius and about 340 degrees Celsius). The RF power may be controlled at between about 100 Watts and about 800 Watts, for example, about 400 Watts. The plasma forming gas, such as $H_2$ gas, may be supplied at between about 3000 sccm and about 5000 sccm, for example, about 4000 sccm. The $H_2$ gas supplied from the substrate edge/substrate bottom may be controlled at between about 200 sccm and about 1000 sccm. The argon gas may be supplied from the substrate edge/substrate bottom at between about 200 sccm and about 1000 sccm.

Figure 2C:
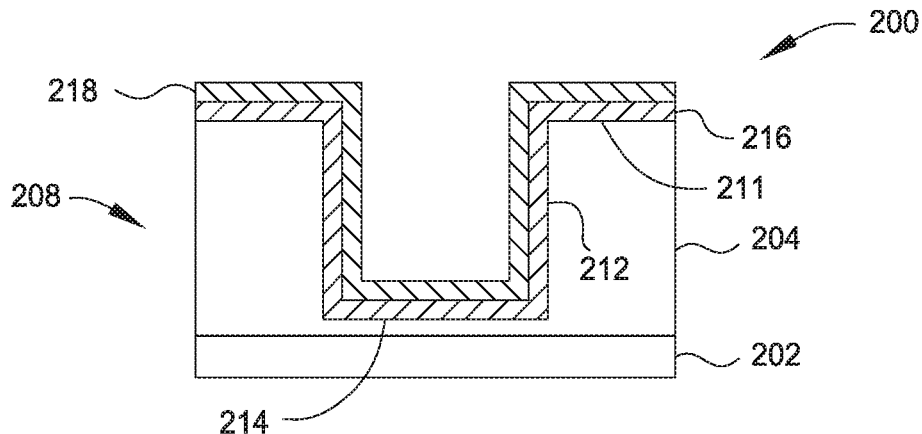

At operation 140, a ruthenium-containing layer deposition process may be performed to deposit a ruthenium-containing layer 218 on the barrier and/or liner layer 216 as shown in FIG. 2C. Not to be bound by theory, but it is believed that the ruthenium-containing layer 218 reduces agglomeration and improves the morphology of the subsequently deposited cobalt layers at increased processing temperatures. In one implementation, the ruthenium-containing layer 218 is a continuous film. In another implementation, the ruthenium-containing layer 218 is a discontinuous film. The ruthenium-containing layer 218 may have a thickness within a range from about 1 Å to about 30 Å, more narrowly within a range from about 1 Å to about 20 Å, more narrowly within a range from about 3 Å to about 20 Å, more narrowly within a range from about 3 Å to about 10 Å, and more narrowly within a range from about 5 Å A to about 10 Å. The ruthenium-containing layer 218 is generally deposited by atomic layer deposition (ALD), plasma-enhanced ALD (PE-ALD), chemical vapor deposition (CVD), or a physical vapor deposition (PVD) processes. In one implementation, the ruthenium-containing layer 218 has a thickness from about 3 Å to about 20 Å and is deposited by a metal organic vapor deposition (MOCVD) process.

In the implementations wherein the deposition process is a MOCVD process, the deposition process may be performed by supplying a deposition gas mixture including at least a ruthenium (Ru) containing precursor into the processing chamber. The ruthenium (Ru) containing precursor may have a formula of $R_xRu_yR'_z$, where R and R' are H, $CH_3$, $C_2H_5$, $C_3H_7$, CO, NCO, methyl, ethyl, propyl, isopropyl, butyl, isobutyl, tertiary butyl, alkyl or aryl group and x, y and z are integers having a range between 1 and 8.

In one implementation, the ruthenium precursor is one or more of methyl-cyclohexadiene ruthenium tricarbonylcyclohexadiene, ruthenium tricarbonyl, butadiene ruthenium tricarbonyl, dimethylbutadiene ruthenium tricarbonyl, or modified dienes with $Ru(CO)_3$.

In some implementations, a variety of other processing gases may be added to the gas mixture to modify properties of the ruthenium (Ru) containing layer. For example, a reactive gas, such as hydrogen ($H_2$), ammonia ($NH_3$), a mixture of hydrogen ($H_2$) and nitrogen ($N_2$), or combinations thereof, may be optionally and selectively supplied in the deposition gas mixture to assist depositing the ruthenium (Ru) containing layer. A carrier gas, such as nitrogen ($N_2$) and nitric oxide (NO), or and/or inert gas, such as argon (Ar) and helium (He), may be supplied with the deposition gas mixture into the processing chamber. The addition of different reactive gases or inert gases may change the film structure and/or film chemical components, such as reflectivity, thus adjusting the deposited film to have a desired film property to meet different process requirements.

Alternatively, in the example wherein the ruthenium (Ru) containing layer is formed by a physical vapor deposition process (PVD), such as a sputtering deposition process, a target with metal ruthenium (Ru), metal ruthenium (Ru) containing material, or ruthenium (Ru) containing alloy may be utilized to perform a sputtering deposition to form the ruthenium (Ru) containing layer.

During deposition of the ruthenium (Ru) containing layer, several process parameters may be regulated the process. In one implementation suitable for processing a 300 mm substrate, the process pressure may be controlled at between about 0.1 Torr and about 100 Torr (e.g., between about 0.1 Torr and about 80 Torr; between about 1 Torr and about 20 Torr or between about 7 Torr and about 30 Torr). The spacing between the substrate and showerhead may be controlled at about 200 mils to about 1000 mils. The substrate temperature is between about 100 degrees Celsius and about 900 degrees Celsius (e.g., between about 125 degrees Celsius and about 350 degrees Celsius; between about 200 degrees Celsius and about 300 degrees Celsius; or between about 250 degrees Celsius and about 340 degrees Celsius).

In one implementation, the ruthenium-containing layer 218 is deposited by a thermal CVD process that involves co-flowing a ruthenium-containing precursor with hydrogen gas ($H_2$).

In some implementations, the ruthenium-containing layer 218 is exposed to a hydrogen soak process. In one implementation, the hydrogen soak process is performed by stopping the flow of the ruthenium-containing precursor from operation 140 while continuing to flow hydrogen gas from operation 140. Not to be bound by theory but it is believed that the hydrogen soak process reduces impurities in the ruthenium-containing layer 218. In some implementations, the substrate surface is exposed to a soak process at a temperature in the range from about 100 degrees Celsius to about 600 degrees Celsius (e.g., from about 100 degrees Celsius to about 400 degrees Celsius; or from about 200 degrees Celsius to about 300 degrees Celsius). The soak process is typically performed at a pressure in the range from about 1 Torr to about 150 Torr, preferably from about 5 Torr to about 90 Torr. In some examples, the pressure is in a range from about 5 Torr to about 20 Torr. In another example, the pressure is about 40 Torr. The soak is usually conducted to the substrate surface and exposed ruthenium-containing layer for a period of time in the range from about 5 seconds to about 90 seconds. In one aspect, the soak will last for about 60 seconds or less. In another aspect, the soak will last for about 30 seconds or less. In another aspect, the soak will last for about 10 seconds. The flow rate of hydrogen gas is generally in the range from about 10 sccm to about 2,000 sccm, preferably from about 50 sccm to about 500 sccm.

In some implementations, the ruthenium-containing layer 218 is exposed to a plasma treatment process. The plasma treatment process may be similar to the plasma treatment process of operation 130. Not to be bound by theory but it is believed that the plasma treatment process reduces surface roughness of the deposited ruthenium-containing layer 218 by reducing impurities and increasing film density.

Exemplary plasma forming gases for the plasma treatment process of the ruthenium-containing layer 218 include hydrogen ($H_2$), nitrogen ($N_2$), ammonia ($NH_3$), and combinations thereof. During the plasma treatment process, several process parameters are also regulated. In one implementation, the process pressure is controlled at between about 7 Torr and about 30 Torr. The processing temperature is between about 125 degrees Celsius and about 250 degrees Celsius. The RF power may be controlled at between about 100 Watts and about 800 Watts, for example, about 400 Watts. The plasma forming gas, such as $H_2$ gas, may be supplied at between about 3000 sccm and about 5000 sccm, for example, about 4000 sccm. The $H_2$ gas supplied from the substrate edge/substrate bottom may be controlled at between about 200 sccm and about 1000 sccm. The argon gas may be supplied from the substrate edge/substrate bottom at between about 200 sccm and about 1000 sccm.

Figure 2D:
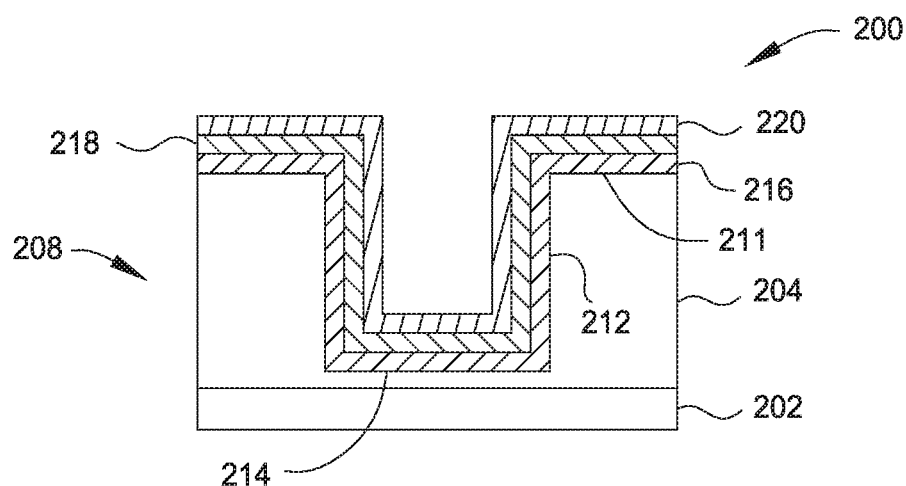
Figure 2E:
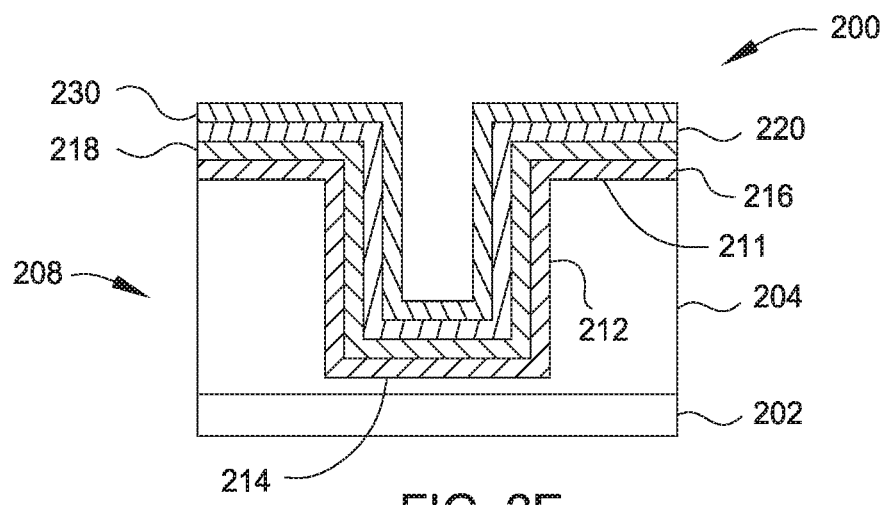

At operation 150 a cobalt seed layer deposition process may be performed to deposit a cobalt seed layer 220 on the ruthenium-containing layer 218 as shown in FIG. 2D. The cobalt seed layer 220 may have a thickness within a range from about 1 Å to about 100 Å, (e.g., within a range from about 1 Å to about 30 Å; within a range from about 1 Å to about 20 Å; within a range from about 3 Å to about 20 Å; within a range from about 3 Å to about 10 Å; within a range from about 10 Å to about 20 Å; and within a range from about 5 Å to about 10 Å). The cobalt seed layer 220 is generally deposited by atomic layer deposition (ALD), plasma-enhanced ALD (PE-ALD), or chemical vapor deposition (CVD). In one implementation, the cobalt seed layer is deposited by a CVD process having a thickness from about 3 Å to about 20 Å. CVD cobalt usually contains impurities (e.g., carbon and/or oxygen), therefore, subsequent processing, such as plasma treatment or annealing in a hydrogen environment is typically used to reduce the impurities. However, annealing may lead to thin film agglomeration, which leads to gap-fill issues. The ruthenium-containing layer 218 allows for the removal of impurities without agglomeration.

In some implementations, the workpiece 200 is exposed to the cobalt precursor at a flow rate of about 750 sccm to about 1000 sccm. In some implementations, suitable cobalt precursors may include one or more of cobalt carbonyl complexes, cobalt amidinate compounds, cobaltocene compounds, cobalt dienyl complexes, cobalt nitrosyl complexes, derivatives thereof, complexes thereof, plasmas thereof, or combinations thereof. In some implementations, dicobalt hexacarbonyl acetyl compounds may be used to form the cobalt seed layer 220. Dicobalt hexacarbonyl acetyl compounds may have the chemical formula of $(CO)_6Co_2(RC\equiv CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl tert-butylacetylene (CCTBA, $(CO)_6Co_2(HC\equiv C^tBu)$) is the cobalt precursor. Other examples of dicobalt hexacarbonyl acetyl compounds include dicobalt hexacarbonyl methylbutylacetylene $((CO)_6Co_2(MeC\equiv C^tBu))$, dicobalt hexacarbonyl phenylacetylene $((CO)_6Co_2(HC\equiv CPh))$, hexacarbonyl methylphenylacetylene $((CO)_6Co_2(MeC\equiv CPh))$, dicobalt hexacarbonyl methylacetylene $((CO)_6Co_2(HC\equiv CMe))$, dicobalt hexacarbonyl dimethylacetylene $((CO)_6Co_2(MeC\equiv CMe))$, derivatives thereof, complexes thereof, or combinations thereof. Other exemplary cobalt carbonyl complexes include cyclopentadienyl cobalt bis(carbonyl) $(CpCo(CO)_2)$, allyl tricarbonyl cobalt $((CO)_3Co(CH_2CH=CH_2))$, or derivatives thereof, complexes thereof, or combinations thereof. The cobalt precursor may be supplied with a carrier gas, such as argon gas.

Examples of the alternative reagents (i.e., reducing agents used with cobalt precursors for forming the cobalt materials during the deposition process as described herein may include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof. In one particular example, the reagent or reducing agent used herein is ammonia ($NH_3$).

In some implementations, the method may further comprise flowing a reactant gas, such as hydrogen gas ($H_2$), along with the precursor gases. General processing conditions for forming the cobalt seed layer 220 discussed above include maintaining process chamber pressure at, for example, about 15 to about 25 Torr. In one implementation suitable for processing a 300 mm substrate, the process pressure may be maintained at about 0.1 Torr to about 80 Torr, for example, about 15 Torr to about 25 Torr. The substrate temperature of the deposition process is maintained between about 150 degrees Celsius and about 400 degrees Celsius, for example, about 150 degrees Celsius and about 300 degrees Celsius; or for example, from about 150 degrees Celsius and about 200 degrees Celsius.

In some implementations, the cobalt seed layer 220 may be formed by a plasma assisted deposition process, such as a plasma enhanced chemical vapor deposition process, or a thermal chemical vapor deposition process. In some implementations, for example, the workpiece 200 may be exposed to the cobalt precursor in a plasma state. The plasma may be formed by coupling sufficient energy, for example radio frequency (RF) energy from a power source to ignite the cobalt precursor to form the plasma. In some implementations, the power source may illustratively provide about 400 watts, of power at a suitable frequency, such as about 13.56 MHz. The plasma facilitates a decomposition of the precursors, causing a deposition of material on the workpiece 200, to form the cobalt seed layer 220.

In one implementation, operation 140 and operation 150 are repeated a desired number of times to deposit a thin layer of ruthenium followed by a thin layer of cobalt in a cyclic process to form a multi-layer ruthenium and cobalt laminate structure.

Optionally, at operation 160, the cobalt seed layer 220 is exposed to a thermal annealing process to improve properties of the cobalt seed layer 220. In some implementations, the thermal annealing process may be performed in-situ in the same processing chamber as the cobalt seed layer deposition process. In some implementations, the thermal annealing process may be performed in a separate processing chamber. In one implementation, the thermal annealing process performed at operation 160 may have a temperature range between about 200 degrees Celsius and about 1400 degrees Celsius (e.g., between about 200 degrees Celsius and about 500 degrees Celsius; between about 300 degrees Celsius and about 500 degrees Celsius; or between about 400 degrees Celsius and about 450 degrees Celsius). During the thermal annealing process, a gas mixture including at least a hydrogen-containing gas and/or an inert gas (e.g., argon) is supplied into the processing chamber. The gas mixture may be supplied to the annealing chamber using either a static process where the chamber is filled with gas prior to the anneal process or a continuous flow process where the gas mixture is continuously flowed through the annealing chamber during the anneal process.

In one implementation, operation 160 may be performed by supplying a gas mixture including at least one of a hydrogen-containing gas, an inert gas, and a nitrogen containing as into the annealing chamber at a flow rate between about 10 sccm and about 10,000 sccm (e.g., between about 100 sccm and about 2000 sccm), controlling a chamber pressure of about 0.1 Torr and about 100 Torr, for example, about 0.5 Torr and about 15 Torr, such as, between about 5 Torr and about 8 Torr, while maintaining a temperature range between about 150 degrees Celsius and about 500 degrees Celsius (for example, between about 300 degrees Celsius and about 475 degrees Celsius, or between about 400 degrees Celsius and about 450 degrees Celsius) and performing the thermal annealing process, optionally while rotating the substrate, for between about 30 seconds and about 600 seconds. Suitable examples of gases for the gas mixture supplied in the thermal annealing chamber may include a hydrogen gas, a nitrogen containing gas, an inert gas (e.g., argon) or other gases as needed.

Next at operation 170, following formation of the cobalt seed layer 220, a cobalt layer 230 may be deposited on the cobalt seed layer 220. For example, the cobalt material may be deposited on the upper surface of the substrate, as well as over the sidewalls 212 and the bottom surface 214 of the feature definition 206, to form the cobalt layer 230. In some implementations, the cobalt material may be deposited by a physical vapor deposition process. In one implementation, the physical vapor deposition process may be performed at a temperature between room temperature (e.g., 20 to 25 degrees Celsius) and about 500 degrees Celsius. Due to the selectivity of the physical vapor deposition process, the cobalt layer 230 may be thicker in regions disposed on the upper surface of the substrate 202 as compared to one or more regions within the feature definition 206 (e.g., on the sidewalls 212, the bottom surface 214, or both). In some implementations, the cobalt layer 230 is thicker on the bottom surface 214 and thinner on the sidewalls 212.

Figure 2F:
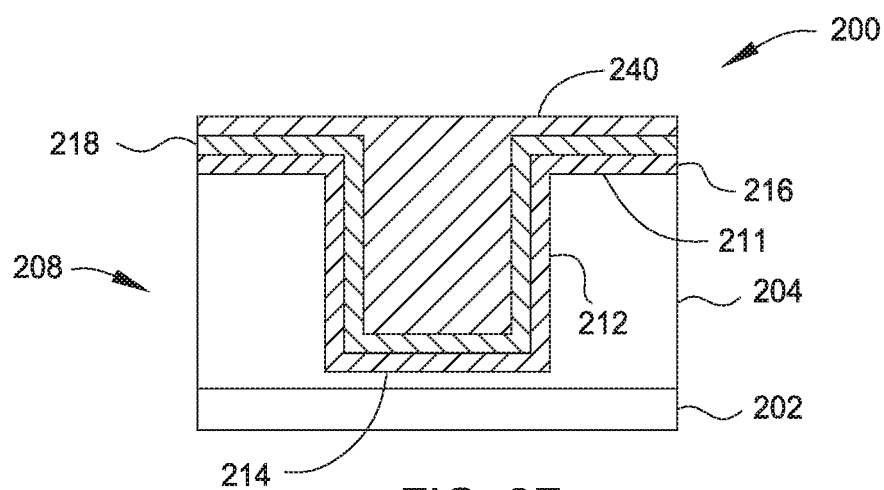

Optionally, the cobalt layer 230 may be heated, or annealed, to draw the deposited material into the feature definition 206 (for example, via capillary action). The heating process may be performed at a temperature ranging from about 100 to about 900 degrees Celsius (e.g., from about 150 to about 400 degrees Celsius). The ruthenium-containing layer 218 and the cobalt seed layer 220 advantageously allows for the cobalt layer 230 to re-flow with cobalt de-wetting into, and fill, the opening without forming a void in the opening or allow cobalt layer inside the feature to recrystallize and heat the voids without de-wetting. Upon completion of the heating process, the bottom surface 214 of the feature definition 206 may be covered with deposited material. In some implementations, the process of depositing the cobalt material and annealing the deposited cobalt material may be repeated to fill the feature definition 206. Alternatively, after filling a portion of the feature definition 206 is filled as described herein, the remainder of the feature definition 206 may be filled using an electroplating process. Further, when the feature definition 206 has been filled by the conductive material, the feature definition 206 may be filled above the level of the upper surface of the substrate and/or deposited material, for example from the cobalt layer 230, may remain on the upper surface of the substrate 202. Accordingly, techniques, such as wet clean in an acidic solution, chemical or electrochemical mechanical polishing, or the like may be used to remove excess deposited material from the upper surface, such that the feature definition 206 is filled with a bulk cobalt material 240 up to about an equivalent level with the upper surface, as depicted in FIG. 2F. As depicted in FIG. 2F, the bulk cobalt material 240 is formed from the cobalt seed layer 220 and the cobalt layer 230.

Figure 3:
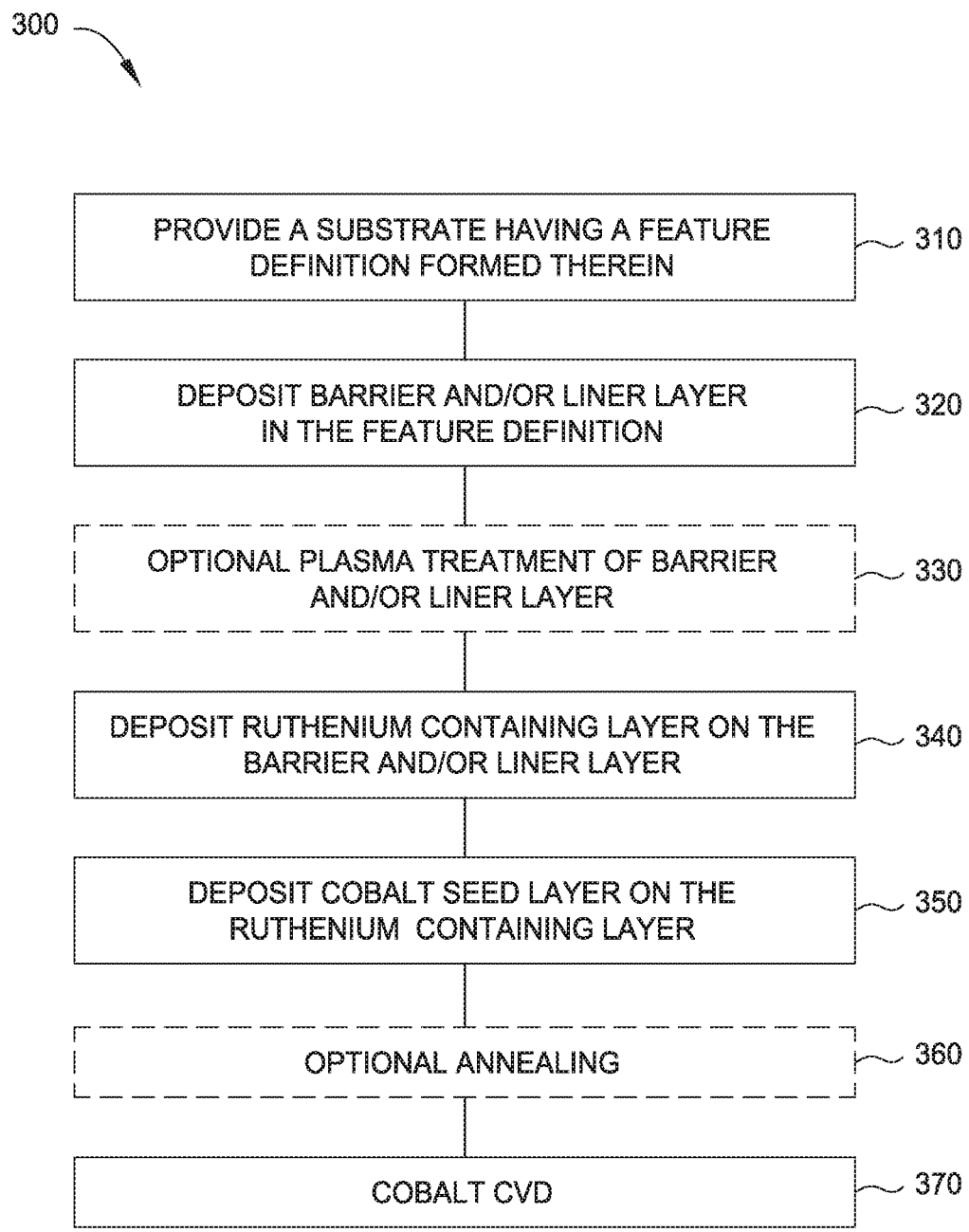
FIG. 3 depicts another flow diagram of a process sequence for forming a cobalt layer in a semiconductor device in accordance with one or more implementations of the present disclosure.

FIG. 3 depicts another flow diagram of a processing sequence 300 for forming a cobalt layer in a semiconductor device in accordance with one or more implementations of the present disclosure. The processing sequence 300 is similar to processing sequence 100 except that the bulk cobalt material is deposited by a CVD process instead of a PVD process. At operation 310, a substrate having a feature definition formed therein is provided. Operation 310 may be performed similarly to operation 110. At operation 320, a barrier and/or liner layer is deposited in the feature definition. Operation 320 may be performed similarly to operation 120. Optionally, at operation 330, the barrier and/or liner layer is exposed to a plasma treatment. Operation 330 may be performed similarly to operation 130. At operation 340, a ruthenium-containing layer is formed on the barrier and/or liner layer. Operation 340 may be performed similarly to operation 140. At operation 350, a cobalt seed layer is formed on the ruthenium-containing layer. Operation 350 may be performed similarly to operation 150. In one implementation, operation 340 and operation 350 are repeated a desired number of times to deposit a thin layer of ruthenium followed by a thin layer of cobalt in a cyclic process to form a multi-layer ruthenium and cobalt laminate structure.

Optionally, at operation 360 the cobalt seed layer is exposed to an annealing process. Operation 360 may be performed similarly to operation 160.

At operation 370, the bulk cobalt material is deposited on the cobalt seed layer by a chemical vapor deposition process. In some implementations, the bulk cobalt material is deposited by a cyclic CVD process. In one implementation, the cyclic CVD process includes repeating operation 360 and operation 370 until a predetermined thickness of the bulk cobalt material is achieved. If the predetermined thickness of the bulk cobalt material has not been achieved additional cycles starting from the cobalt CVD process of operation 360 followed by the anneal process of operation 370. For example, if the total thickness of the bulk cobalt material is 300 Å and each portion of the bulk cobalt material is deposited at 50 Å/cycle then 6 cycles of (50 Å of deposition followed by an anneal) will be needed.

In another implementation, the cyclic CVD process includes repeating operation 370 followed by a plasma treatment process as described in operation 330 until a predetermined thickness of the bulk cobalt material is achieved. If the predetermined thickness of the bulk cobalt material has not been achieved additional cycles starting from the cobalt CVD process of operation 370 followed by the plasma treatment process. For example, if the total thickness of the bulk cobalt material is 300 Å and each portion of the bulk cobalt material is deposited at 50 Å/cycle then 6 cycles of (50 Å of deposition followed by a plasma treatment) will be needed. The plasma treatment process reduced the roughness of the deposited cobalt layer allowing for more uniform deposition of subsequent cobalt layers by reducing impurities in cobalt and promoting grain growth.

Figure 4:
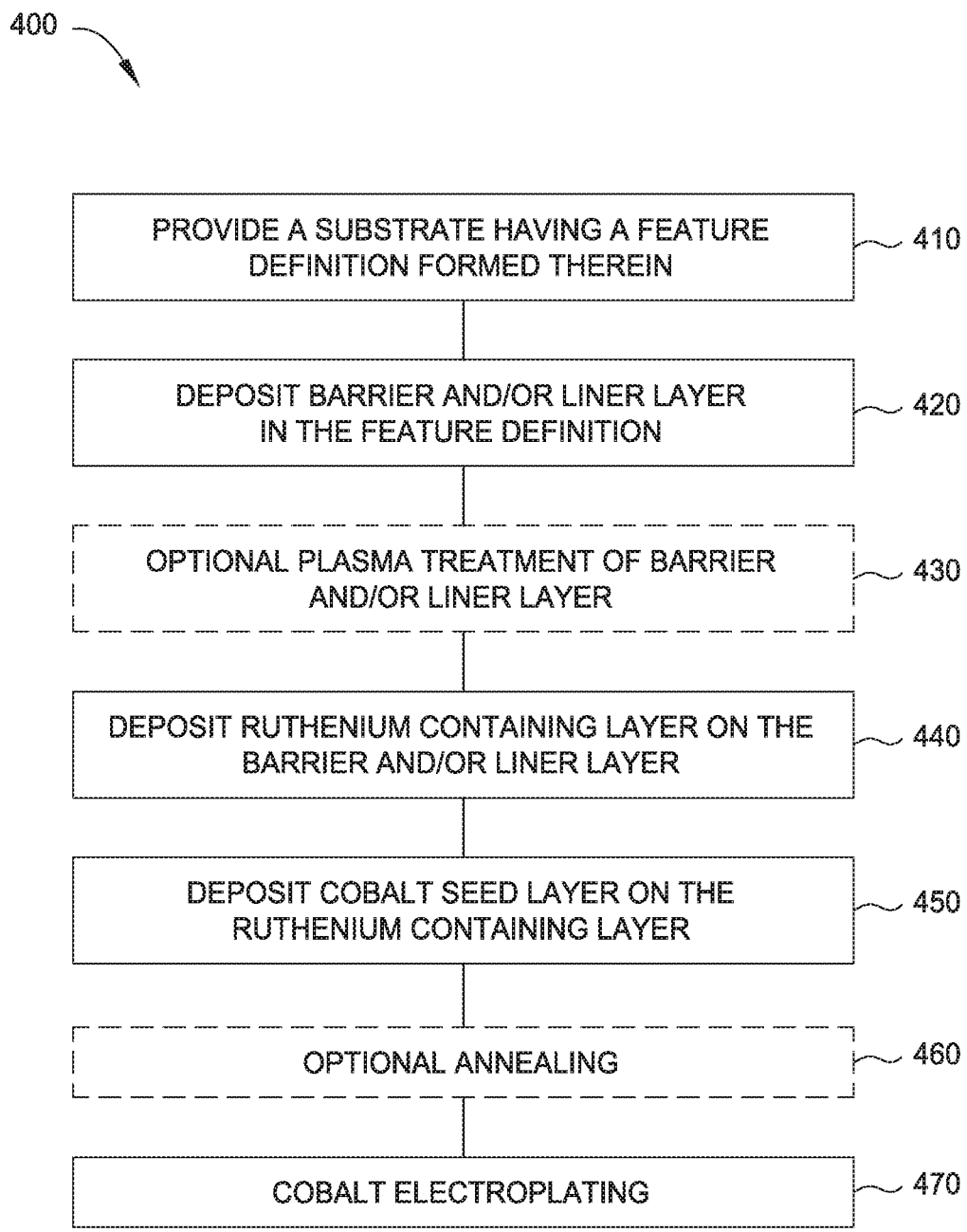
FIG. 4 depicts another flow diagram of a process sequence for forming a cobalt layer in a semiconductor device in accordance with one or more implementations of the present disclosure.

FIG. 4 depicts another flow diagram of a processing sequence 400 for forming a cobalt layer in a semiconductor device in accordance with one or more implementations of the present disclosure. Processing sequence 400 is similar to processing sequence 100 except that the bulk cobalt material is deposited by an electroplating process instead of a PVD process. At operation 410, a substrate having a feature definition formed therein is provided. Operation 410 may be performed similarly to operation 110. At operation 420, a barrier and/or liner layer is deposited in the feature definition. Operation 420 may be performed similarly to operation 120. Optionally, at operation 330, the barrier and/or liner layer is exposed to a plasma treatment. Operation 430 may be performed similarly to operation 130. At operation 440, a ruthenium-containing layer is formed on the barrier and/or liner layer. Operation 440 may be performed similarly to operation 140. At operation 450, a cobalt seed layer is formed on the ruthenium-containing layer. Operation 450 may be performed similarly to operation 150. In one implementation, operation 440 and operation 450 are repeated a desired number of times to deposit a thin layer of ruthenium followed by a thin layer of cobalt in a cyclic process to form a multi-layer ruthenium and cobalt laminate structure.

Optionally, at operation 460 the cobalt seed layer is exposed to an annealing process. Operation 460 may be performed similarly to operation 160.

At operation 470, the bulk cobalt material is deposited on the cobalt seed layer by an electroplating process.

Figure 5:
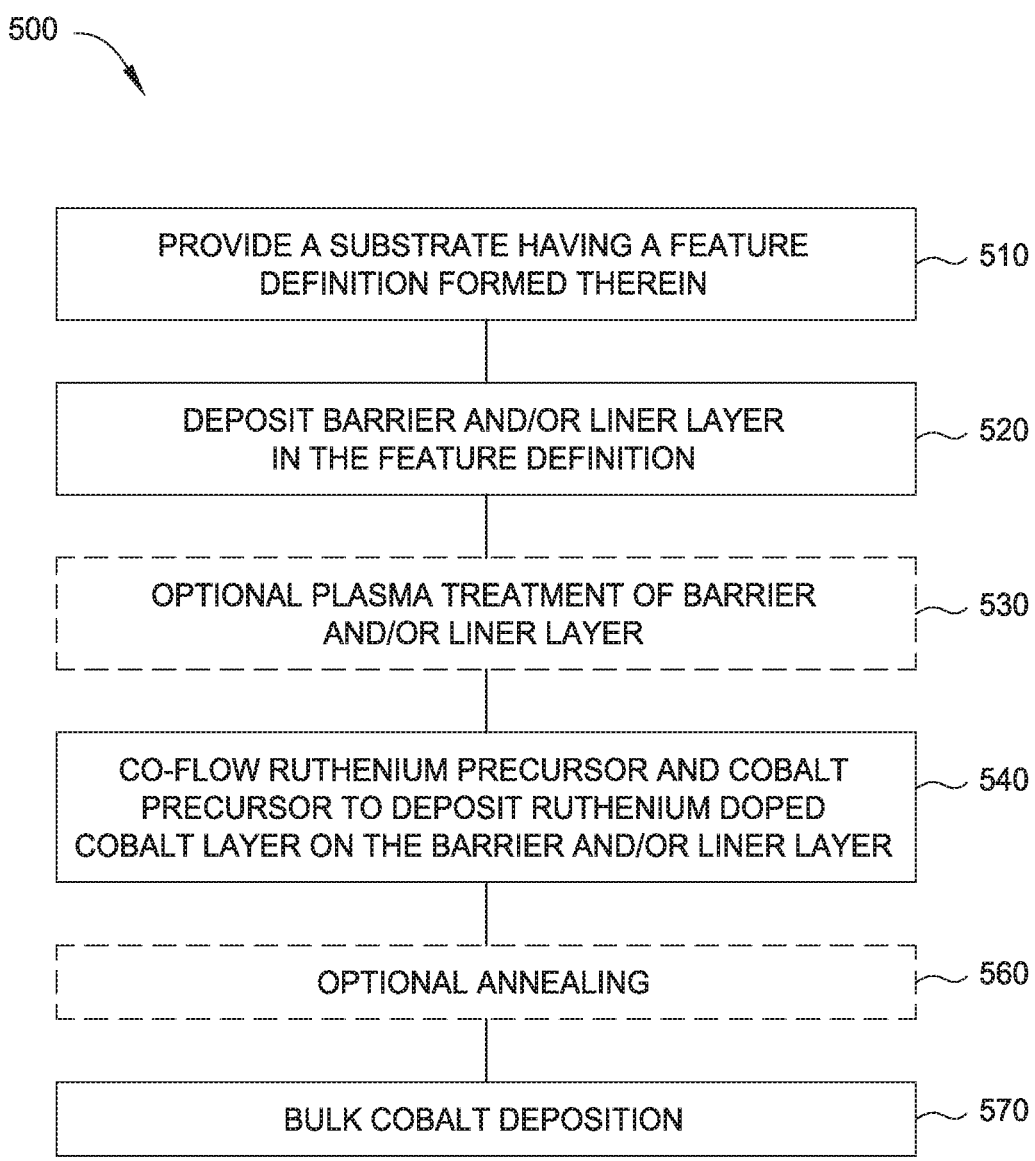
FIG. 5 depicts another flow diagram of a process sequence for forming a cobalt layer in a semiconductor device in accordance with one or more implementations of the present disclosure.

FIG. 5 depicts another flow diagram of a processing sequence 500 for forming a cobalt layer in a semiconductor device in accordance with one or more implementations of the present disclosure. Processing sequence 500 is similar to processing sequence 100 except that a ruthenium doped cobalt seed layer is deposited by co-flowing one or more ruthenium precursors with one or more cobalt precursors. At operation 510, a substrate having a feature definition formed therein is provided. Operation 510 may be performed similarly to operation 110. At operation 520, a barrier and/or liner layer is deposited in the feature definition. Operation 520 may be performed similarly to operation 120. Optionally, at operation 530, the barrier and/or liner layer is exposed to a plasma treatment. Operation 530 may be performed similarly to operation 130. At operation 540, a ruthenium doped cobalt seed layer is formed on the barrier and/or liner layer. In one implementation, the ruthenium doped cobalt seed layer is formed by a CVD process that includes co-flowing one or more ruthenium precursors with one or more cobalt precursors. In one implementation, the CVD process is performed using the CVD parameters, cobalt precursors and ruthenium precursors described herein. Optionally, at operation 560 the cobalt seed layer is exposed to an annealing process. Operation 560 may be performed similarly to operation 160.

At operation 570, a bulk cobalt material is deposited on the ruthenium doped cobalt seed layer. The bulk cobalt material may be depositing using any suitable deposition method. In one implementation, the bulk cobalt material is deposited by a PVD cobalt reflow process as described in operation 170. In another implementation, the bulk cobalt material is deposited by an electroplating process as described in operation 470. In yet another implementation, the bulk cobalt material is deposited by a cobalt CVD process as described in operation 370. In some implementations, the bulk cobalt material is deposited by a cyclic CVD process. In one implementation, the cyclic CVD process includes repeating operation 560 and operation 570 until a predetermined thickness of the bulk cobalt material is achieved. If the predetermined thickness of the bulk cobalt material has not been achieved additional cycles starting from the cobalt CVD process of operation 560 followed by the anneal process of operation 570 are performed. For example, if the total thickness of the bulk cobalt material is 300 Å and each portion of the bulk cobalt material is deposited at 50 Å/cycle then 6 cycles of (50 Å of deposition (operation 560) followed by an anneal (operation 570)) is used.

In another implementation, the cyclic CVD process includes repeating operation 570 followed by a plasma treatment process as described in operation 530 until a predetermined thickness of the bulk cobalt material is achieved. If the predetermined thickness of the bulk cobalt material has not been achieved additional cycles starting from the cobalt CVD process of operation, 570 followed by the plasma treatment process of operation 530 may be performed. For example, if the total thickness of the bulk cobalt material is 300 Å and each portion of the bulk cobalt material is deposited at 50 Å/cycle then 6 cycles of (50 Å of deposition (operation 570) followed by a plasma treatment (operation 530)) is used.

Figure 6:
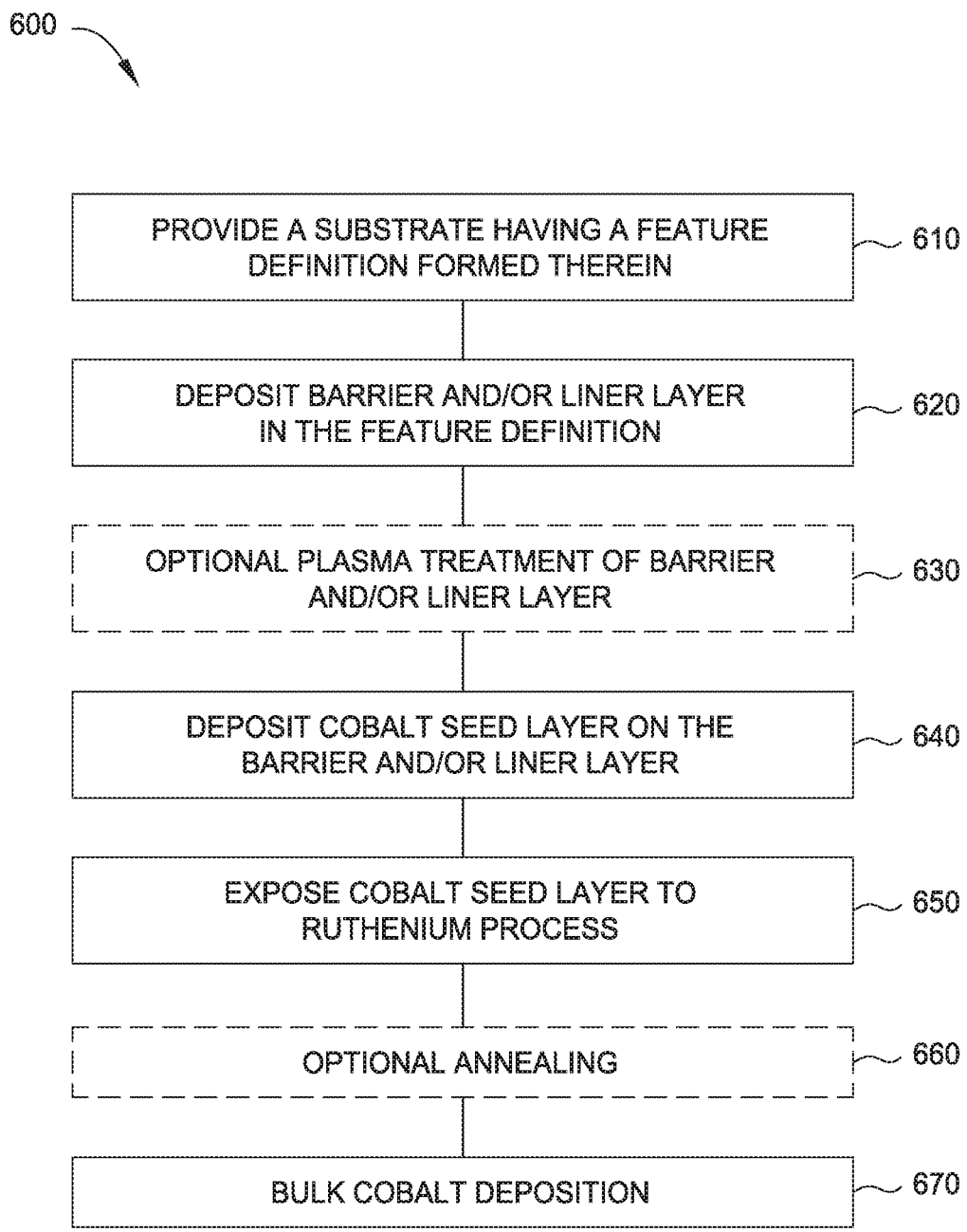
FIG. 6 depicts another flow diagram of a process sequence for forming a cobalt layer in a semiconductor device in accordance with one or more implementations of the present disclosure.

FIG. 6 depicts another flow diagram of a processing sequence 600 for forming a cobalt layer in a semiconductor device in accordance with one or more implementations of the present disclosure. Processing sequence 600 is similar to processing sequence 100 except that a ruthenium doped cobalt seed layer is deposited by depositing a cobalt seed layer on the barrier and/or liner layer at operation 640 followed by exposing the cobalt seed layer to a ruthenium process at operation 650. At operation 610, a substrate having a feature definition formed therein is provided. Operation 610 may be performed similarly to operation 110. At operation 620, a barrier and/or liner layer is deposited in the feature definition. Operation 620 may be performed similarly to operation 120. Optionally, at operation 630, the barrier and/or liner layer is exposed to a plasma treatment. Operation 630 may be performed similarly to operation 130.

At operation 640, a cobalt seed layer is deposited on the barrier and/or liner layer. Operation 640 may be performed similarly to operation 150. At operation 650, the cobalt seed layer is exposed to a ruthenium process. In one implementation, the ruthenium process of operation 650 includes at least one of depositing a thin layer of ruthenium on the cobalt seed layer, physical implantation of ruthenium into the cobalt seed layer, and/or soaking the cobalt seed layer in a ruthenium-containing environment. In one implementation, operation 650 is performed similarly to operation 140 to deposit a thin layer of ruthenium over the cobalt seed layer. In one implementation, operation 650 is a ruthenium PVD process, which dopes the cobalt seed layer with ruthenium. In one implementation, the cobalt seed layer is exposed to a ruthenium-containing environment in a soak process to dope the cobalt seed layer with ruthenium.

In one implementation, operation 640 and operation 650 are repeated a desired number of times to deposit a thin layer of ruthenium followed by a thin layer of cobalt in a cyclic process to form a multi-layer ruthenium and cobalt laminate structure.

Optionally, at operation 660 the ruthenium doped cobalt seed layer is exposed to an annealing process. Operation 660 may be performed similarly to operation 160.

At operation 670, a bulk cobalt material is deposited on the ruthenium doped cobalt seed layer. The bulk cobalt material may be depositing using any suitable deposition method. In one implementation, the bulk cobalt material is deposited by a PVD cobalt reflow process as described in operation 170. In another implementation, the bulk cobalt material is deposited by an electroplating process as described in operation 470. In yet another implementation, the bulk cobalt material is deposited by a cobalt CVD process as described in operation 370. In some implementations, the bulk cobalt material is deposited by a cyclic CVD process. In one implementation, the cyclic CVD process includes repeating operation 660 and operation 670 until a predetermined thickness of the bulk cobalt material is achieved. If the predetermined thickness of the bulk cobalt material has not been achieved additional cycles starting from the cobalt CVD process of operation 660 followed by the anneal process of operation 670 are performed. For example, if the total thickness of the bulk cobalt material is 300 Å and each portion of the bulk cobalt material is deposited at 50 Å/cycle then 6 cycles of (50 Å of deposition (operation 660) followed by an anneal (operation 670)) will be needed.

In another implementation, the cyclic CVD process includes repeating operation 670 followed by a plasma treatment process as described in operation 630 until a predetermined thickness of the bulk cobalt material is achieved. If the predetermined thickness of the bulk cobalt material has not been achieved additional cycles starting from the cobalt CVD process of operation 670 followed by the plasma treatment process of operation 630 may be performed. For example, if the total thickness of the bulk cobalt material is 300 Å and each portion of the bulk cobalt material is deposited at 50 Å/cycle then 6 cycles of (50 Å of deposition (operation 670) followed by a plasma treatment (operation 630)) is used.

The methods described herein may be performed in individual process chambers that may be provided in a standalone configuration or as part of a cluster tool, for example, a multi-chamber processing system 700 (i.e., cluster tool) described below with respect to FIG. 7. Examples of the multi-chamber processing system 700 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some implementations the inventive methods discussed above may advantageously be performed in an integrated tool such that there are limited or no vacuum breaks between processing steps. For example, reduced vacuum breaks may limit or prevent contamination of the seed layer or other portions of the substrate.

Figure 7:
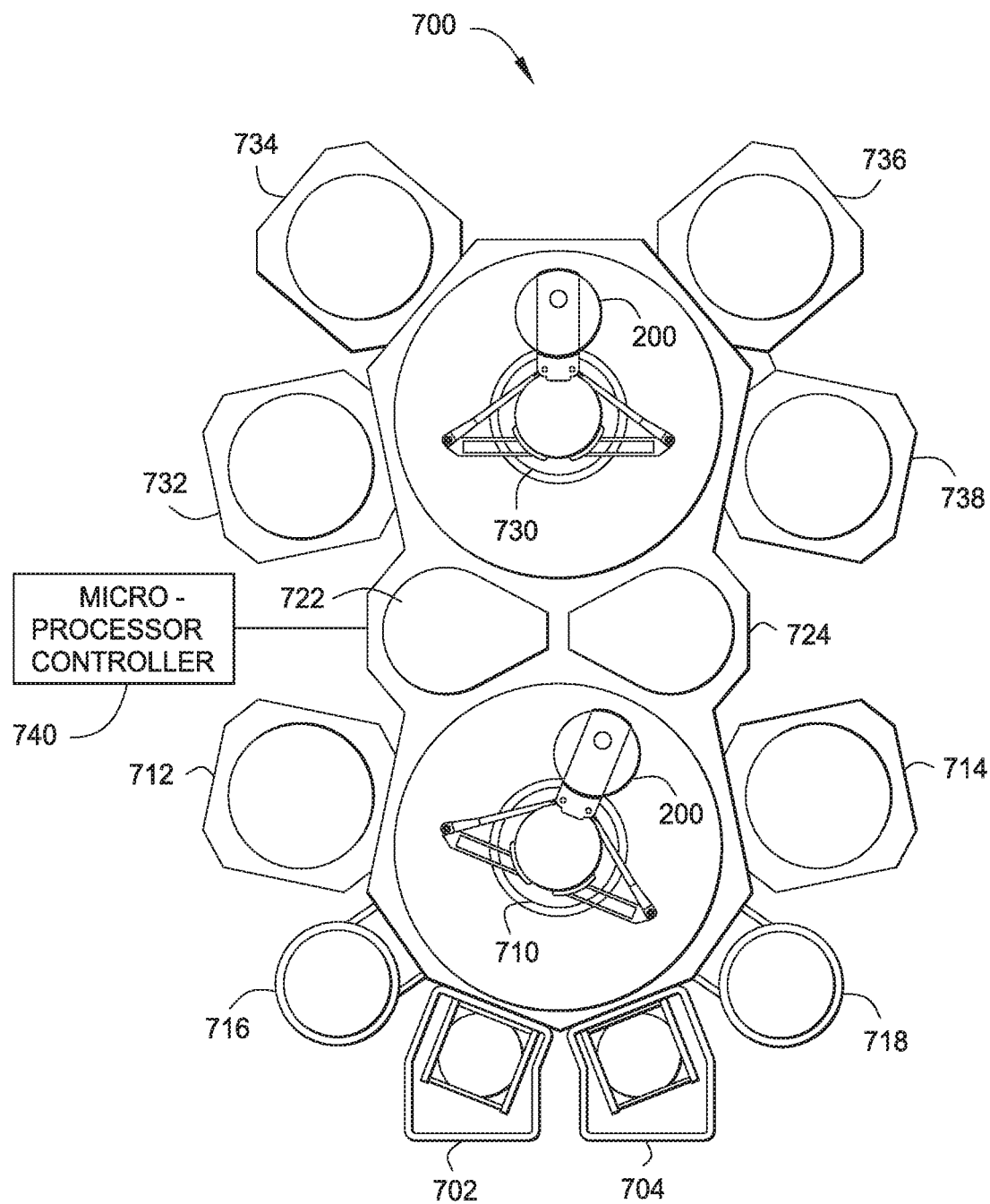
FIG. 7 depicts a schematic top view diagram of an illustrative multi-chamber processing system that may be used to perform the methods described herein.

FIG. 7 is a schematic top view diagram of the multi-chamber processing system 700 that can be adapted to perform a metal layer deposition process as disclosed herein. The system 700 can include one or more load lock chambers 702 and 704 for transferring workpiece 200 into and out of the system 700. Generally, the system 700 is maintained under vacuum and the load lock chambers 702 and 704 can be "pumped down" to introduce workpiece 200 introduced into the system 700. A first robot 710 can transfer the workpiece 200 between the load lock chambers 702 and 704, and a first set of one or more substrate processing chambers 712, 714, 716, and 718. Each processing chamber 712, 714, 716, and 718 is configured to be at least one of a substrate deposition process, such as cyclical layer deposition (CLD), atomic layer deposition (ALD), chemical vapor deposition (CVD), physical vapor deposition (PVD), etch, degas, pre-cleaning orientation, anneal, and other substrate processes. Furthermore, one of the processing chambers 712, 714, 716, and 718 may also be configured to perform a pre-clean process prior to performing a deposition process or a thermal annealing process on the workpiece 200. The position of the processing chamber 718 utilized to perform a thermal annealing process relative to the other processing chambers 712, 714, 716 is for illustration, and the position of the processing chamber 718 may be optionally be switched with any one of the processing chambers 712, 714, 716 if desired.

The first robot 710 can also transfer workpiece 200 to/from one or more transfer chambers 722 and 724. The transfer chambers 722 and 724 can be used to maintain ultrahigh vacuum conditions while allowing workpiece 200 to be transferred within the system 700. A second robot 730 can transfer the workpiece 200 between the transfer chambers 722 and 724 and a second set of one or more processing chambers 732, 734, 736 and 738. Similar to the processing chambers 712, 714, 716, and 718, the processing chambers 732, 734, 736, and 738 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 712, 714, 716, 732, 734, 736, and 738 can be removed from the system 700 if not necessary for a particular process to be performed by the system 700. After the preclean, deposition and/or a thermal annealing process is performed in the processing chamber 718, the substrate may further be transferred to any of the processing chambers 712, 714, 716, 732, 734, 736, and 738 of the system 700 to perform other process as needed.

The microprocessor controller 740 controls the operation of the system 700 using a direct control of the processing chambers 712, 714, 716, 718, 732, 734, 736, and 738 or alternatively, by controlling the computers (or controllers) associated with the processing chambers 712, 714, 716, 718, 732, 734, 736, and 738 and the system 700. In operation, the microprocessor controller 740 enables data collection and feedback from the respective chambers and systems to optimize performance of the system 700. The microprocessor controller 740 generally includes a Central Processing Unit (CPU), a memory, and a support circuit. The CPU may be one of any form of a general-purpose computer processor that can be used in an industrial setting. The support circuit is conventionally coupled to the CPU and may comprise a cache, clock circuits, input/output subsystems, power supplies, and the like. Software routines, such as a method as described above may be stored in the memory and, when executed by the CPU, transform the CPU into a specific purpose computer (microprocessor controller) 740. The software routines may also be stored and/or executed by a second controller (not shown) that is located remotely from the system 700.

In summary some of the benefits of some implementations of the present disclosure provide methods for filling a feature definition with a cobalt material, such that the cobalt material is deposited free of voids, seams, and other defects. The improved methods described herein are especially advantageous for filling high aspect ratio features. The implementations described herein provide for cobalt films having reduced agglomeration at higher processing temperatures. It has been found by the inventors that deposition of a thin layer of ruthenium material prior to, during deposition of, and/or after deposition of the cobalt layer reduces agglomeration. This reduction in agglomeration allows for annealing of the deposited cobalt, which removes impurities from the deposited cobalt leading to reduced resistance.

Having disclosed several implementations, it will be recognized by those of skill in the art that various modifications, alternative constructions, and equivalents may be used without departing from the spirit of the disclosed implementations. Additionally, a number of well-known processes and elements have not been described in order to avoid unnecessarily obscuring the present disclosure. Accordingly, the above description should not be taken as limiting the scope of the disclosure.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

A "soak" or "soak process" as used herein is intended to refer to a quantity of a particular compound that is introduced into a reaction zone of a processing chamber to activate a surface of a substrate. The activation of the surface may comprise hydrating a surface, catalyzing a surface, or forming halide terminated surfaces. A particular soak process may include a single compound or a mixture/combination of two or more compounds. Soak processes generally have durations of about one second or more.

While the foregoing is directed to implementations of the present disclosure, other and further implementations of the disclosure may be devised without departing from the basic scope thereof, and the scope thereof is determined by the claims that follow.

The invention claimed is:

1. A method of forming a cobalt layer on a substrate, comprising:
    exposing a substrate having a feature definition formed in a first surface of the substrate to a cobalt precursor to form a cobalt layer over a sidewall and a bottom surface of the feature definition; and exposing the cobalt layer to a ruthenium process to form a ruthenium doped cobalt layer, wherein the ruthenium process comprises soaking the cobalt layer in a ruthenium-containing environment, wherein the soaking comprises:

co-flowing a ruthenium precursor and hydrogen gas; and exposing the ruthenium doped cobalt layer to a soak process at a temperature from about 100 degrees Celsius to about 600 degrees Celsius, comprising:

stopping the flow of the ruthenium precursor while continuing the flow of the hydrogen gas.

2. The method of claim 1, further comprising forming a cobalt bulk layer on the ruthenium doped cobalt layer to fill the feature definition, wherein the cobalt bulk layer is deposited by a chemical vapor deposition process, a physical vapor deposition process, or an electroplating process.

3. The method of claim 1, further comprising annealing the ruthenium doped cobalt layer at a temperature between about 100 degrees Celsius and about 900 degrees Celsius in a hydrogen-containing atmosphere.

4. The method of claim 1, wherein the feature definition has a high aspect ratio greater than 10:1.

5. The method of claim 1, wherein the soak process is performed at a pressure in a range from about 5 Torr to about 20 Torr.

6. The method of claim 1, wherein the cobalt precursor is one or more of cobalt carbonyl complexes, cobalt amidinate compounds, cobaltocene compounds, cobalt dienyl complexes, cobalt nitrosyl complexes, dicobalt hexacarbonyl acetyl compounds, cyclopentadienyl cobalt bis(carbonyl) ($CpCo(CO)_2$), tricarbonyl allyl cobalt (($CO)_3Co(CH_2CH=CH_2)$), or a combination thereof.

7. The method of claim 1, wherein the ruthenium precursor is one or more of methyl-cyclohexadiene ruthenium tricarbonylcyclohexadiene, ruthenium tricarbonyl, butadiene ruthenium tricarbonyl, dimethyl butadiene ruthenium tricarbonyl, or modified dienes with $Ru(CO)_3$.

8. The method of claim 1, further comprising repeating exposing the substrate to the cobalt precursor and exposing the cobalt layer to the ruthenium process to form a multilayer cobalt and ruthenium structure.

9. A method of forming a cobalt layer on a substrate, comprising:

exposing a substrate having a feature definition formed in a first surface of the substrate to a cobalt precursor to form a cobalt layer on the first surface of the substrate and on a sidewall and a bottom surface of the feature definition;

exposing the cobalt layer to a ruthenium process to form a ruthenium doped cobalt layer, wherein the ruthenium process comprises soaking the cobalt layer in a ruthenium-containing environment, wherein the soaking comprises:

co-flowing a ruthenium precursor and hydrogen gas; and exposing the ruthenium doped cobalt layer to a soak process at a temperature from about 100 degrees Celsius to about 600 degrees Celsius, comprising:

stopping the flow of the ruthenium precursor while continuing the flow of the hydrogen gas;

annealing the ruthenium doped cobalt layer; and forming a bulk cobalt layer on the ruthenium doped cobalt layer.

10. The method of claim 9, wherein the cobalt precursor is one or more of cobalt carbonyl complexes, cobalt amidinate compounds, cobaltocene compounds, cobalt dienyl complexes, cobalt nitrosyl complexes, dicobalt hexacarbonyl acetyl compounds, cyclopentadienyl cobalt bis(carbonyl) ($CpCo(CO)_2$), tricarbonyl allyl cobalt (($CO)_3Co(CH_2CH=CH_2)$), or a combination thereof.

11. The method of claim 10, wherein the ruthenium precursor is one or more of methyl-cyclohexadiene ruthenium tricarbonylcyclohexadiene, ruthenium tricarbonyl, butadiene ruthenium tricarbonyl, dimethyl butadiene ruthenium tricarbonyl, or modified dienes with $Ru(CO)_3$.

12. The method of claim 9, wherein the cobalt bulk layer is deposited by a chemical vapor deposition process, a physical vapor deposition process, or an electroplating process.

13. The method of claim 12, wherein annealing the ruthenium doped cobalt layer is performed at a temperature from about 100 degrees Celsius to about 900 degrees in a hydrogen-containing atmosphere.

14. The method of claim 9, wherein the feature definition has a high aspect ratio greater than 10:1.

15. A method of forming a cobalt layer on a substrate, comprising:

forming a cobalt layer on a substrate having a feature definition formed in a first surface of the substrate, wherein cobalt layer is formed on a sidewall and a bottom surface of the feature definition; and exposing the cobalt layer to a ruthenium process to form a ruthenium doped cobalt layer, wherein the ruthenium process comprises soaking the cobalt layer in a ruthenium-containing environment, wherein the soaking comprises:

co-flowing a ruthenium precursor and hydrogen gas; and exposing the ruthenium doped cobalt layer to a soak process at a temperature from about 100 degrees Celsius to about 600 degrees Celsius, comprising:

stopping the flow of the ruthenium precursor while continuing the flow of the hydrogen gas; and forming a bulk cobalt layer on the ruthenium doped cobalt layer via a cyclic cobalt deposition process, comprising:

exposing the substrate to a cobalt precursor to deposit a portion of the bulk cobalt layer in the feature definition;

exposing the portion of the bulk cobalt layer to either a plasma treatment process of a hydrogen annealing process; and repeating exposing the substrate to the cobalt precursor and exposing the portion of the bulk cobalt layer to either the plasma treatment process of the hydrogen annealing process.

16. The method of claim 15, wherein the cobalt precursor is one or more of cobalt carbonyl complexes, cobalt amidinate compounds, cobaltocene compounds, cobalt dienyl complexes, cobalt nitrosyl complexes, dicobalt hexacarbonyl acetyl compounds, cyclopentadienyl cobalt bis(carbonyl) ($CpCo(CO)_2$), tricarbonyl allyl cobalt (($CO)_3Co(CH_2CH=CH_2)$), or a combination thereof.

17. The method of claim 16, wherein the ruthenium precursor is one or more of methyl-cyclohexadiene ruthenium tricarbonylcyclohexadiene, ruthenium tricarbonyl, butadiene ruthenium tricarbonyl, dimethyl butadiene ruthenium tricarbonyl, or modified dienes with $Ru(CO)_3$.

18. The method of claim 15, further comprising annealing the ruthenium doped cobalt layer at a temperature between about 100 degrees Celsius and about 900 degrees in a hydrogen-containing atmosphere.

19. The method of claim 15, wherein the feature definition has a high aspect ratio greater than 10:1.

20. The method of claim 15, wherein the cobalt layer is formed by atomic layer deposition (ALD), plasma-enhanced ALD (PE-ALD), or chemical vapor deposition (CVD).

\* \* \* \* \*

UNITED STATES PATENT AND TRADEMARK OFFICE
CERTIFICATE OF CORRECTION

PATENT NO. : 11,043,415 B2
APPLICATION NO. : 16/564489
DATED : June 22, 2021
INVENTOR(S) : Zhiyuan Wu et al.

It is certified that error appears in the above-identified patent and that said Letters Patent is hereby corrected as shown below:

In the Specification

In Column 7, Line 7, delete "5 Å A" and insert -- 5 Å --, therefor.

In Column 14, Line 61, delete "50 ↑/cycle" and insert -- 50 Å/cycle --, therefor.

In the Claims

In Column 18, Line 19, in Claim 13, after "degrees" insert -- Celsius --.

In Column 18, Line 27, in Claim 15, after "wherein" insert -- the --.

In Column 19, Line 1, in Claim 18, after "degrees" insert -- Celsius --.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*